United States Patent [19]

Giannella

[11] Patent Number: 5,068,702
[45] Date of Patent: Nov. 26, 1991

[54] PROGRAMMABLE TRANSISTOR

[75] Inventor: Giovanni P. Giannella, Sunnyvale, Calif.

[73] Assignee: Exar Corporation, San Jose, Calif.

[21] Appl. No.: 300,246

[22] Filed: Jan. 19, 1989

Related U.S. Application Data

[63] Continuation of Ser. No. 846,380, Mar. 31, 1986, abandoned.

[51] Int. Cl.$^5$ ...................... H01L 29/72; H01L 27/02
[52] U.S. Cl. ........................................ 357/35; 357/34; 357/36; 357/44
[58] Field of Search ...................... 357/34, 35, 36, 45, 357/44

[56] References Cited

U.S. PATENT DOCUMENTS

| | | | |
|---|---|---|---|
| 3,567,965 | 3/1971 | Weinerth | 357/36 |
| 3,569,800 | 3/1971 | Collins | 357/36 |
| 3,736,477 | 5/1973 | Berger et al. | 357/44 |
| 3,890,634 | 6/1975 | Ruegg | 357/35 |
| 3,956,641 | 5/1976 | Berger et al. | 357/35 |
| 4,047,220 | 9/1977 | Ferro et al. | 357/36 |
| 4,131,806 | 12/1978 | Kirschner | 357/44 |
| 4,199,775 | 4/1980 | Agraz-Guerena et al. | 357/44 |
| 4,371,792 | 2/1983 | Dobkin | 357/44 |
| 4,489,341 | 12/1984 | Mayrand | 357/44 |
| 4,564,855 | 1/1986 | Van Zanten | 357/44 |

FOREIGN PATENT DOCUMENTS

| | | |
|---|---|---|
| 0029369 | 11/1980 | European Pat. Off. |
| 0056571 | 1/1982 | European Pat. Off. |
| 58-35967 | 3/1983 | Japan ...................... 357/36 |
| 59-5665 | 1/1984 | Japan ...................... 357/36 |
| 59-211260 | 11/1984 | Japan ...................... 357/45 |
| 61-48973 | 3/1986 | Japan ...................... 357/36 |

OTHER PUBLICATIONS

Patent Abstracts of Japan, vol. 8, No. 250 (e-279) [1687], 16th Nov. 1984; and JP-A-59 126 650 (Nippon Denso K.K.) 21-07-1984.
Advertisement "The Orderly World of Sahni Semicustom": Circle No. 25.
"Plessey's High-Density Bipolar Arrays Toggle at 4.5 GHz", Electronics, Sep. 1988 pp. 78-79.

Primary Examiner—Andrew J. James
Assistant Examiner—Ngan Van Ngo
Attorney, Agent, or Firm—Townsend and Townsend

[57] ABSTRACT

An improved cell structure and method for making the same for semicustom chips which can be connected at the metalization step to form either an NPN or a PNP transistor and which has approximately the same cell size as a single PNP or NPN transistor. A central P-doped region forms the emitter of the PNP transistor. This is partially surrounded by another P-doped region which forms the collector of the PNP transistor. An N-doped region is diffused into one of the P-doped regions to form the emitter of an NPN transistor, with the selected P-doped region becoming the base of the NPN transistor. In the gaps of the second P-doped region surrounding the central P-doped region is an N-doped region which forms either the base of the PNP transistor or the collector of the NPN transistor.

35 Claims, 5 Drawing Sheets

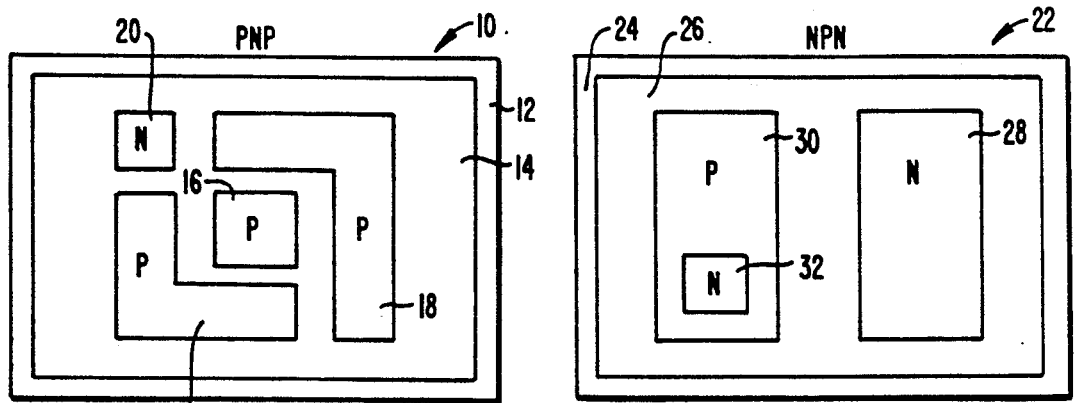
FIG._1. PRIOR ART
FIG._2. PRIOR ART
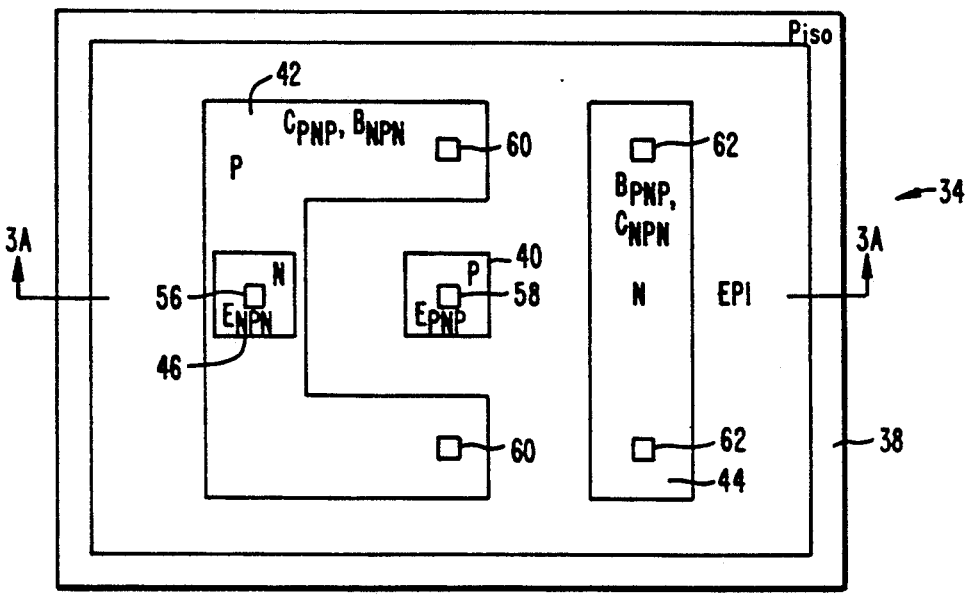
FIG._3.
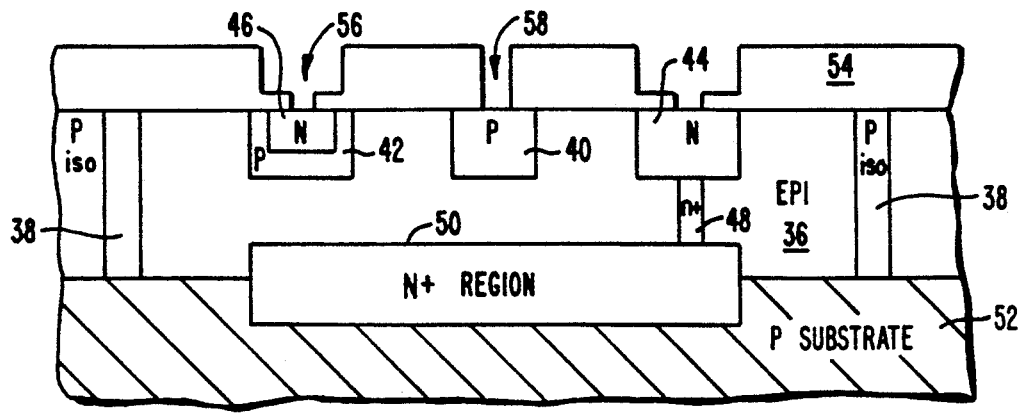
FIG._3A.

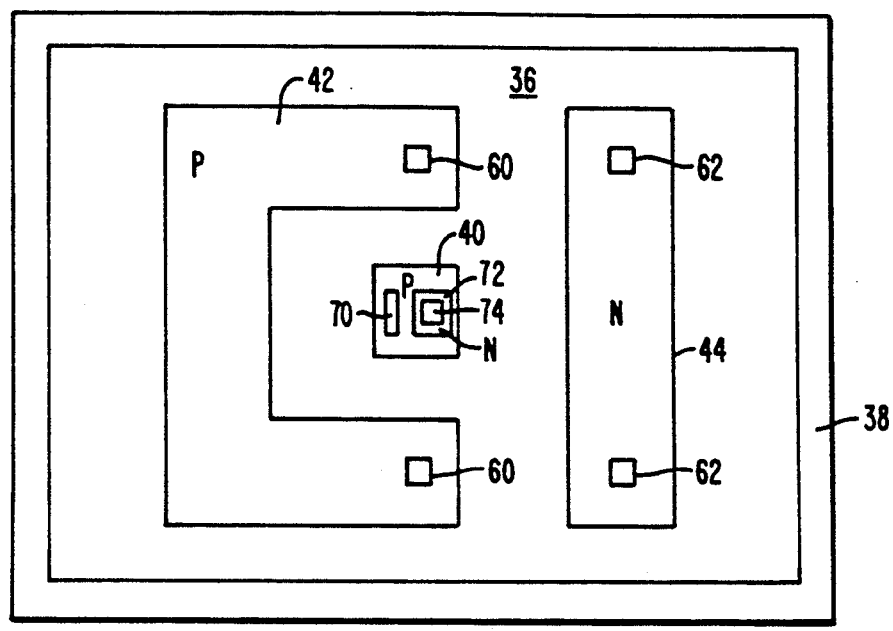
FIG._3B.
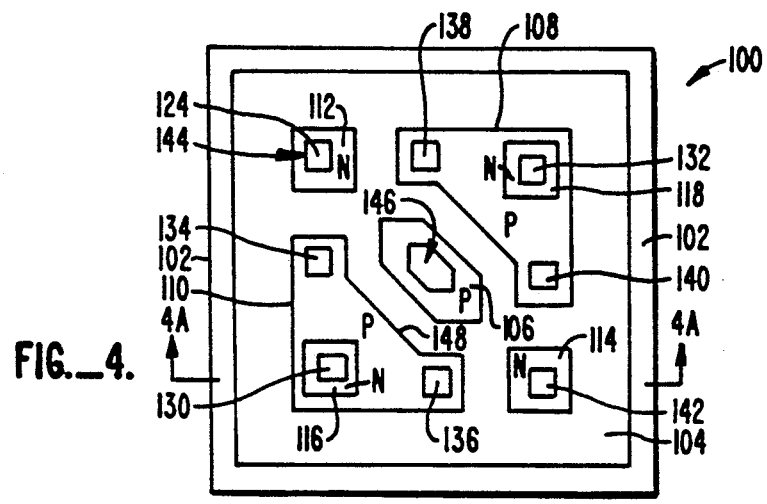
FIG._4.
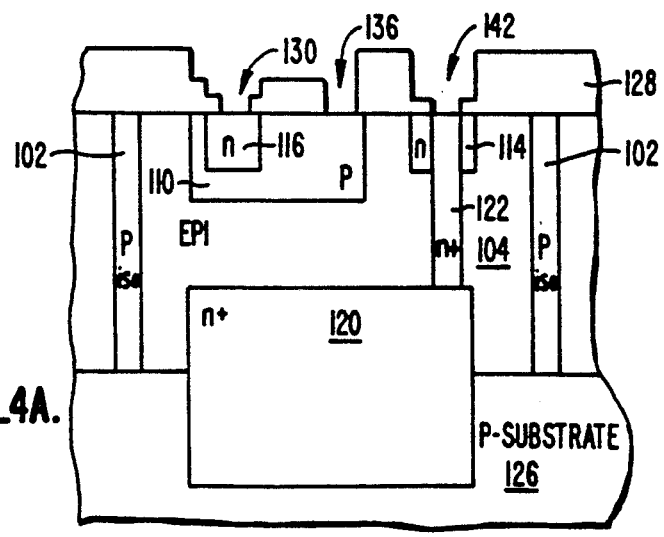
FIG._4A.

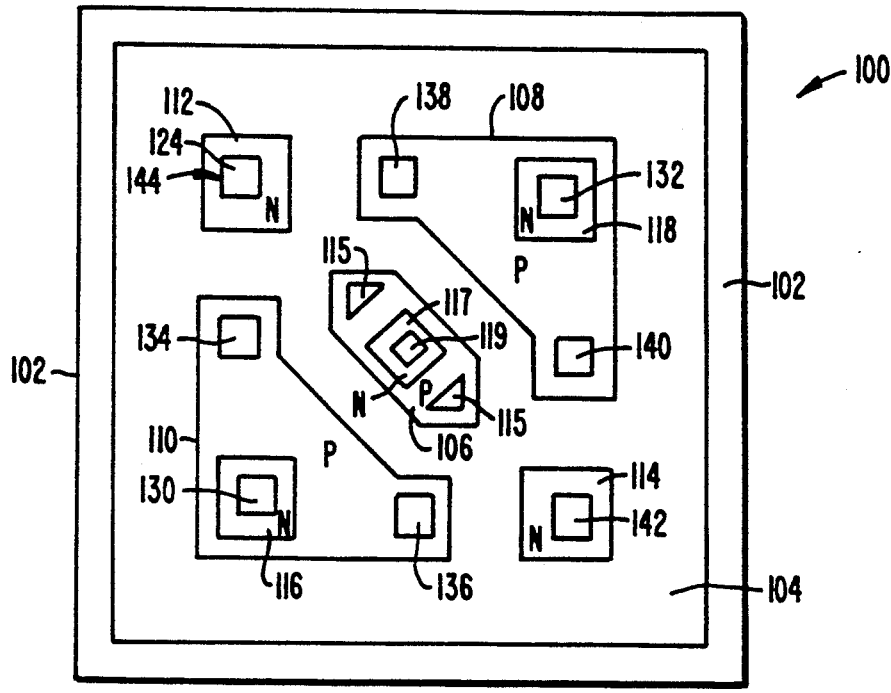
FIG._4B.
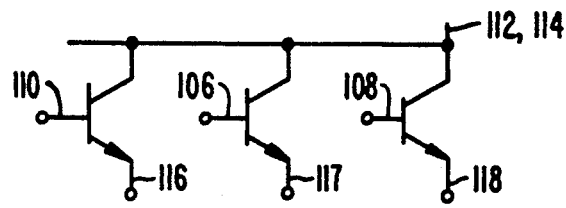
FIG._4C.
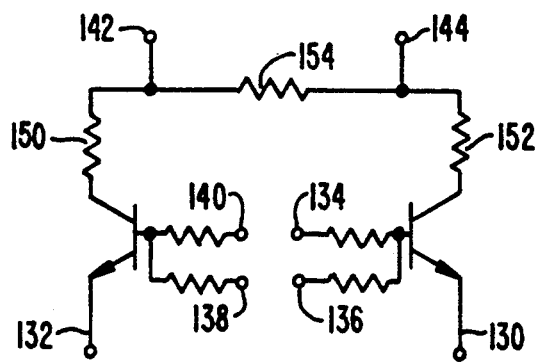
FIG._5.
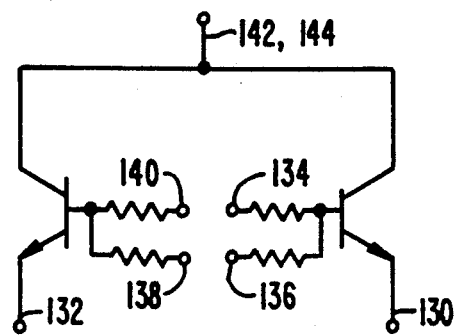
FIG._5A.

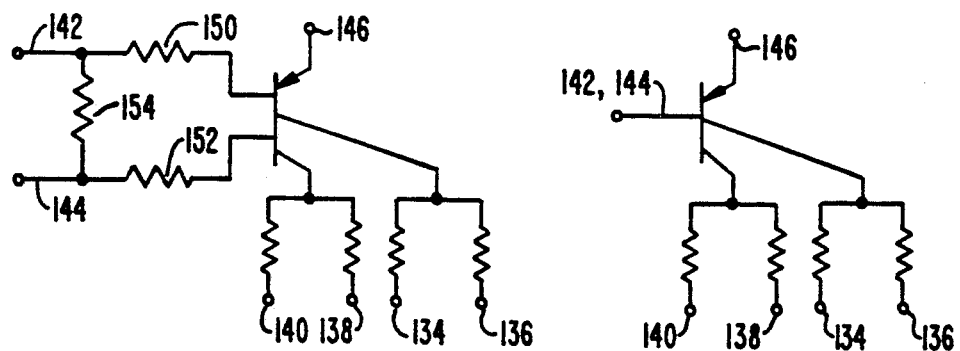
FIG._6.　　　　FIG._6A.
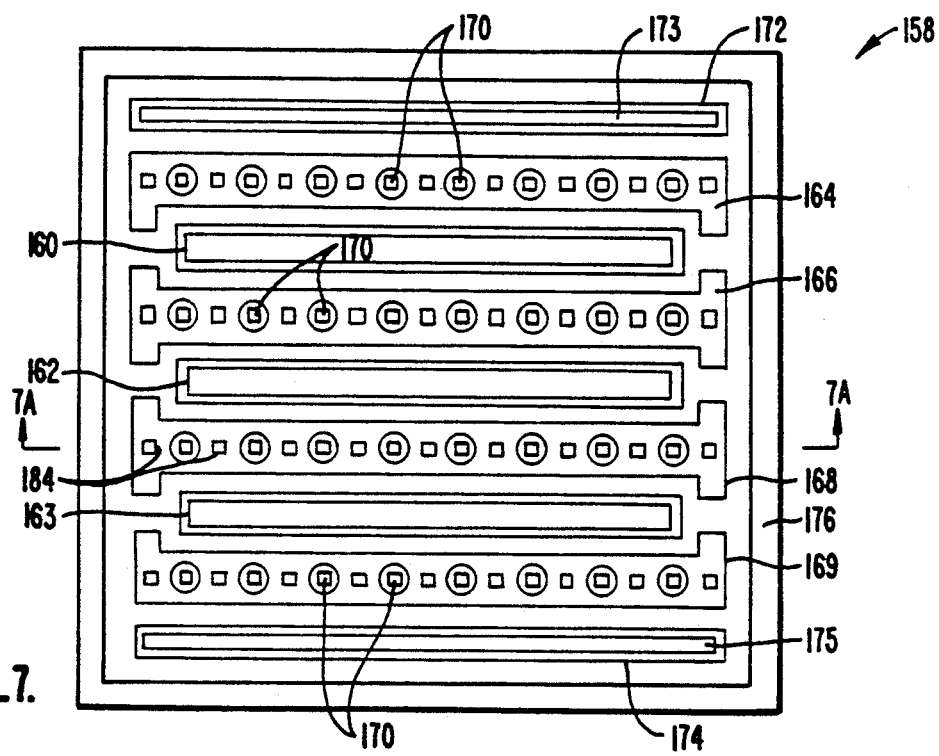
FIG._7.
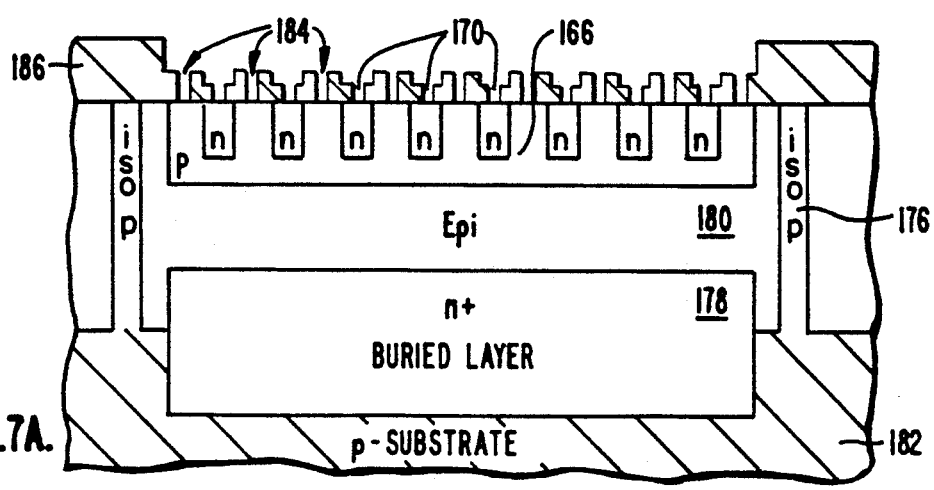
FIG._7A.

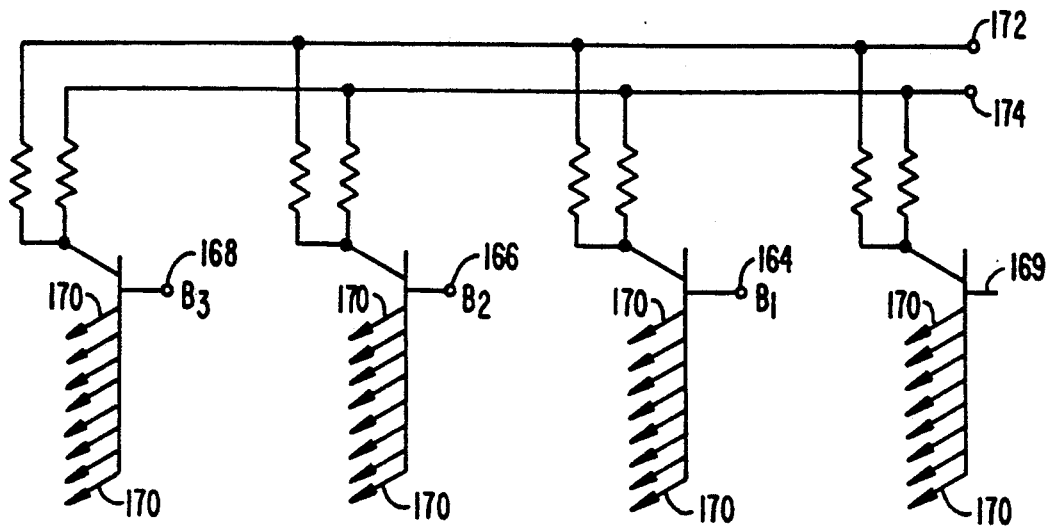
FIG._8.
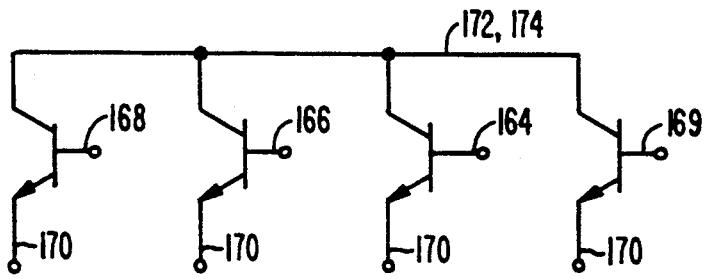
FIG._8A.
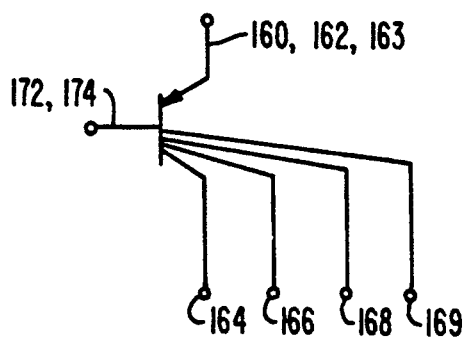
FIG._9.

PROGRAMMABLE TRANSISTOR

This is a continuation of application Ser. No. 06/846,380, filed Mar. 31, 1986, now abandoned.

BACKGROUND

The present invention relates to the structure of transistor cells for semicustom chips.

The semicustom method of designing and fabricating integrated circuits uses prefabricated semiconductor wafers which have completed circuits except for the final process step of device or component interconnection. A cost savings is realized by adapting a standard wafer, which has already been designed and manufactured, to a particular customer's needs by simply designing appropriate metal interconnections. Thus, for each customer, a metal mask is designed which connects the necessary active and passive semiconductor components to form the circuit configuration required by the customer. This method of design and fabrication allows development of a custom circuit in less time and at lower cost than if the entire wafer had to be independently designed for each customer.

A limitation in semicustom design is that the polarity and number of transistors is fixed in the prefabricated wafer and cannot be changed at the metal mask level. Thus, for instance, if the standard wafer has more NPN transistors than a particular customer needs in a circuit, these transistors will be unused and waste valuable space on the wafer. In addition, the routing of the metal interconnections may be difficult and inefficient because a PNP transistor is located at a position where the customer's circuit would ideally require an NPN transistor, or vice versa. The usefulness of a prefabricated wafer is thus limited to circuits which require the approximate number, polarity and location of transistors which are on the standard wafer.

The devices on a standard wafer are formed in a number of cells which contain one or more devices which form the building blocks of a customer's circuit. An example of a typical known cell 10 having a single PNP transistor is shown in FIG. 1. A P-doped isolation well 12 in an epitaxial (EPI) layer 14 defines a border for the cell and isolates it from other devices. A central P- doped region 16 forms the emitter of the transistor with a pair of L shaped P-doped regions 18 forming the collector of the transistor and an N-doped region 20 forming the base of the transistor. This design may vary, but in general base 20 is off to a side while the central emitter 16 is partially surrounded by the collector 18.

FIG. 2 shows an example of a typical known cell 22 for an NPN transistor. A P-doped isolation region 24 in an epitaxial region 26 surrounds cell 22. An N-doped region 28 forms the collector of the transistor and a P-doped region 30 forms the base of the transistor. An N-doped region 32 within P-doped base region 30 forms the emitter of the transistor.

In a semicustom chip, the PNP and NPN transistors of FIGS. 1 and 2 may both be on the same semiconductor wafer, with one or the other being connected as required by the customer's circuit. If there are more of either the PNP or the NPN transistors on the chip than are required by the customer's circuit, the space taken up by all such transistors will be wasted. Some savings of space may be achieved by combining several transistors in a single cell, usually two PNP or two NPN transistors in a cell or, less often, a PNP and an NPN transistor in a single cell. Although the spacing in between cells is thus reduced, the size of the cell is increased by the size of the additional transistors added.

There is thus a need in semicustom chip design for a transistor cell which contains both NPN and PNP transistors but which does not take up the area of two separate NPN and PNP transistors.

SUMMARY OF THE INVENTION

The present invention is an improved cell structure and method for making the same which can be connected at the metalization step to form either an NPN or a PNP transistor and which has approximately the same cell size as a single PNP or NPN transistor. A central P-doped region forms the emitter of the PNP transistor. This is partially surrounded by another P-doped region which forms the collector of the PNP transistor. An N-doped region is diffused into one of the P-doped regions to form the emitter of an NPN transistor, with the selected P-doped region becoming the base of the NPN transistor. In the gaps of the second P-doped region surrounding the central P-doped region is an N-doped region which forms either the base of the PNP transistor or the collector of the NPN transistor.

In the preferred embodiment, there are two P-doped regions surrounding the central PNP emitter, each having an N-doped region for an NPN emitter. These two regions are L-shaped and are located at opposite corners of the cell, with the remaining two corners each containing an N-doped region to form either the base of a PNP transistor or the collector of an NPN transistor. This cell configuration can be connected at the metalization stage to form either dual NPN transistors or a PNP transistor with two collectors.

The N-doped regions preferably have an internal N+ doped region which tunnels down to a buried N+ layer which covers the area beneath the entire cell. This buried N+ region reduces the resistance in the collector area for the NPN transistor. By providing a tunnel connection from the N-doped regions, an unused cell can be used as a cross-under to provide a path for electrical current to go underneath an overlying metal connection.

The present invention thus provides a merged cell structure which places an N-doped NPN emitter region in the middle of the P-doped PNP collector region. Thus, this collector region can either serve as a PNP collector or, with the internally N-doped region, as the emitter and base of the NPN transistor. In addition, the other N-doped region in the merged structure functions either as the base of the PNP the collector of the NPN. This merging technique enables both transistors to occupy approximately the cell area of a single transistor.

For the dual transistor configuration, the placement of the various regions not only provides a compact cell structure but also simplifies the routing of metallic contacts. Each NPN transistor has two base contacts, thus allowing flexibility in the metal connections. In addition, one metal trace unrelated to the transistor cell can be routed between each base contact and the emitter. In the PNP mode, the dual transistor cell has two contacts for each collector which allows a lower voltage saturation and easier routing. This also allows for eight different configurations of the emitter and the other contacts, providing additional flexibility in routing. In addition, if a cell is not used as a transistor, the two collectors can be used as single or matched resistances. This is possible by providing metal contacts to the contact region of each L shaped collector, which are at the respective ends of the L on either side of the N-doped emitter region.

In an alternate embodiment, the transistor cell can form a power transistor by including a series of N-doped regions within the P-doped region to form a series of emitters for the NPN configuration. Two elongated P-doped regions forming PNP emitters are on either side of a central P-doped region having a series of N-doped emitters. These PNP emitter regions are in turn bordered on the outside by additional P-doped regions having N-doped emitters. Outside of these additional P-doped regions, another row on either side is an N-doped region to form the base of a PNP transistor and the collector of the NPN transistor. This configuration allows the cell to form three NPN transistors having a common collector and multiple emitters or a PNP transistor having multiple collectors. The power capability of the transistor cell is increased by increasing a number of N-doped regions for emitters and increasing the length of the various regions.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a diagram of a prior art PNP transistor cell;

FIG. 2 is a diagram of a prior art NPN transistor cell;

FIGS. 3 and 3A are diagrams of a merged PNP, NPN transistor cell according to the present invention with the NPN emitter within the PNP collector;

FIG. 3B is a diagram of an alternate embodiment of the merged PNP, NPN transistor cell of FIG. 3 with the NPN emitter within the PNP emitter;

FIGS. 4 and 4A are diagrams of a preferred embodiment of a dual transistor merged cell according to the present invention;

FIG. 4B is a diagram of an alternate embodiment of the dual transistor merged cell of FIG. 4;

FIG. 4C is a schematic diagram of the transistor cell of FIG. 4B connected as three NPN transistors;

FIGS. 5 and 5A are schematic diagrams of the transistor cell of FIG. 4 connected as a dual NPN transistor;

FIGS. 6 and 6A are schematic diagrams of the transistor cell of FIG. 4 connected as a PNP transistor with dual collectors;

FIGS. 7 and 7A are diagrams of a three transistor power cell with a merged transistor structure according to the present invention;

FIGS. 8 and 8A are schematic diagrams of the cell of FIG. 7 connected as three NPN transistors; and FIG. 9 is a schematic diagram of a transistor cell of FIG. 7 connected as a PNP transistor with four collectors.

DETAILED DESCRIPTION OF THE PREFERRED EMBODIMENTS

FIG. 3 shows a diagram of a merged NPN, PNP transistor cell 34 according to the present invention. FIG. 3A shows a cross-section of the cell along line 3A—3A of FIG. 3. The regions of the cell are diffused into an epitaxial region 36 and the cell is surrounded by a P-doped isolation region 38. A central P-doped region 40 forms the emitter of a PNP transistor. A surrounding P-doped region 42 forms the collector of the PNP transistor, with an N-doped region 44 forming the base of the PNP transistor.

An N-doped region 46 in the middle of P-doped region 42 provides the emitter for an NPN transistor. P-doped region 42 then becomes the base of the NPN transistor, with N-doped region 44 becoming the collector of the NPN transistor.

As can be seen in FIG. 3A, an N+ tunnel 48 connects N-doped region 44 to a buried N+ region 50. N+ region 50 extends beneath all the active regions of cell 34.

Cell 34 can be formed according to standard an N+ region 50, grow epitaxial layer 36, diffuse a P-doped isolation region 38, P-doped regions 40 and 42, N+ regions 44, 46 and 48. Finally, the resulting oxide buildup 54 from the various diffusion steps is etched away to form open contact regions for metalization. A contact region 56 is provided to the emitter 46 of the NPN transistor, a contact region 58 is provided to the emitter 40 of the PNP transistor, contact regions 60 are provided to P-doped region 42 and contact regions 62 are provided to N-doped region 44.

Transistor cell 34 can function as a PNP transistor by providing metalization which provides metal to contact region 62 for the base, to contact region 58 for the emitter and to contact region 60 for the collector. To connect the transistor of cell 34 as an NPN transistor, metalization is provided to couple to contact region 60 as the base, contact region 56 as the emitter and contact region 62 as the collector. The use of N+ diffusion region 48 allows N-doped region 44 to be smaller and provide a lower saturation resistance. This allows the cell size to be smaller. The size of the cell is about 114 microns across each edge of the interior of perimeter 38. This dimension can be reduced using tighter design rules.

FIG. 3B is a diagram of an alternate embodiment of the transistor cell shown in FIG. 3. Instead of placing NPN emitter region 46 in PNP collector region 42, an N-doped NPN emitter region 72 is placed in PNP emitter region 40. A contact region 74 is provided to N-doped region 72 and a contact region 70 is provided to P-doped region 40. The base cf the NPN transistor becomes P-doped region 40, otherwise the NPN and PNP transistors have the same form as shown in FIG. 3.

FIG. 4 is a diagram of a preferred embodiment of a dual transistor cell 100 according to the present invention. FIG. 4A shows a cross-section of the cell of FIG. 4 along lines 4A—4A. A P-doped isolation region 102 in an epitaxial layer 104 surrounds the cell. A P-doped region 106 forms the emitter for a PNP transistor. A pair of P-doped regions 108, 110 provide the collectors of the PNP transistor with N-doped regions 112, 114 providing the base of the PNP transistor.

The NPN transistor is formed with an N-doped region 116 or 118 functioning as the emitter, P-doped region 110 or 108 functioning as the base and N-doped regions 112 or 114 functioning as the collector.

An N+ buried layer 120 extends beneath the diffused regions in the interior of the cell and is connected to N-doped region 114 by an N+ tunnel 122, and to N-doped region 112 by an N+ tunnel 124. The cell is formed on a P-doped substrate 126 and a oxide layer 128 covers the cell except for contact regions. NPN emitter contacts are provided at regions 130, 132 and contacts to P-doped region 110 are provided at contact regions 134, 136 and to P-doped region 108 by contact regions 138, 140. Similarly, contact regions 142, 144 provide a connection to N-doped regions 114, 112, respectively.

When cell 100 is not needed to provide transistors, it can serve other purposes. Cell 100 can be used as a cross-under by providing metal contacts at contact regions 142, 144 to provide a current path through N+ tunnel 122, N+ buried layer 120 and the other N+ tunnel 124. In addition, dual resistances of approximately 300 ohms can be provided. Specifically, by providing metal contacts to contact regions 134, 136, a resistor is formed in between by the resistance of P-region 110. Similarly, a resistor can be formed between contact regions 138 and 140. The amount of the resistance is determined by the distance between N-doped region 116 and a diagonal border 148 of P-doped region 110 and the distance between the two contacts. The use of this diagonal border 148 (rather than a parallel line border to form a perfect L for P-doped region 110) increases the distance between it and N-doped region 116, thereby reducing the percentage error in the amount of the resistance due to variations in this distance from one wafer to the next in the manufacturing process. This allows the resistance across contact regions 134, 136 and 138, 140 to be very closely matched.

Turning now to FIG. 5, a schematic diagram of a dual NPN transistor formed from cell 100 of FIG. 4 is shown. The dual NPN transistor is formed by providing metal connections to contact region 142 for a collector of a first transistor, with contact regions 140 and 138 going to the base of the NPN transistor and contact region 132 going to the emitter of the NPN transistor. The second transistor has a contact 144 for its collector, contacts 134 and 136 for its base and contact 130 for its emitter. Current flowing from contact 142 to contact region 132 must pass through epitaxial region 104, thus providing a resistance 150. Similarly, a resistance 152 is formed for the other transistor, with a resistance 154 existing between the two collector contacts 142 and 144. In addition, there is some resistance between each base contact and the corresponding emitter and collector.

Because resistances 150, 152 and 154 are relatively small, the circuit of FIG. 5 is roughly equivalent to a circuit shown in FIG. 5A. The circuit configuration FIG. 5 is useful for many applications, including Darlington transistor pairs, emitter followers, and emitter area ratioing.

A single PNP transistor with dual collectors can be formed from cell 100 of FIG. 4 by making the metal contacts as shown in FIG. 6. Again, the values of resistors 150, 152 and 154 are relatively small so that the circuit of FIG. 6 is roughly equivalent to the circuit shown in FIG. 6A. The use of a second contact for each collector provides for a lower voltage saturation and also allows easier routing of metal interconnections.

FIG. 4B is a diagram of an alternate configuration of the dual transistor cell of FIG. 4. A N-doped region 117 is provided within P-doped region 106. A contact area 119 is provided to N-doped region 117, with contact areas 115 providing a connection to P-doped region 106. In this configuration, N-doped region 117 can be the emitter of an NPN transistor, with P-doped region 106 being the base. This configuration allows three NPN transistors with a common collector to be formed as shown in FIG. 4C.

FIG. 7 is a top view of a power transistor cell 158 according to the present invention. P-doped regions 160, 162 and 163 form the emitters of PNP transistors. Four additional P-doped regions 164, 166, 168 and 169 each have eight internal N-doped regions 170. N-doped regions 172 and 174 are provided along the edge of the cell.

When connected as PNP transistors, regions 160, 162 and 163 act as emitters, regions 172 and 174 act as bases and regions 164, 166, 168 and 169 act as collectors. When used as an NPN transistor, regions 170 act as the emitters, regions 164, 166, 168 and 169 act as the bases and regions 172, 174 act as collectors.

Cell 158 is surrounded by a P-doped isolation region 176 and has a buried N+ layer 178 as shown in FIG. 7A, which is a cross-section of cell 158 of FIG. 7 along lines 7A—7A. The cell is diffused into an epitaxial region 180 which is on top of a P-doped substrate 182.

N-doped regions 172 and 174 also have interior N+ tunnel regions 173, 175, respectively, down to N+ buried layer 178 similar to tunnel region 122 of FIG. 4A.

As can be seen from FIG. 7A, multiple contacts to P-doped region 166 are formed through openings 184 in oxide layer 186. This allows for a number of contacts to P-doped region 166.

FIG. 8 shows a circuit diagram of the cell of FIG. 7 connected as four NPN transistors in parallel. As can be seen, each transistor has a separate base, multiple emitters and common collectors. The small resistances between the collector regions and between the collector and the base and emitter regions can be disregarded to produce the roughly equivalent circuit of FIG. 8A. By connecting the various leads, the four parallel transistors can be combined as a single power transistor. The size of power cell 158 can be reduced to form a single transistor or can be reduced or expanded to any other number of transistor.

FIG. 9 shows the cell of FIG. 7 connected as a PNP transistor with multiple collectors. Here, N-doped regions 172 and 174 form the base of a PNP transistor. Again, as in FIG. 8, the resistance between N-doped regions 172 and 174 and to the rest of the transistor have relatively small values so that they can be ignored to produce the circuit of FIG. 9. Because of the central location of collector regions 166 and 168, they receive current from multiple emitter regions and can carry more current than collector regions 164 and 168.

Standard processing methods can be used to produce the transistor cells according to the present invention. The substrate is first doped to be P-. The N+ buried layer is then diffused and the N- epitaxial layer is grown. Each diffusion step is performed using the standard steps of growing an oxide, depositing a photo-resist coating, masking the coating, irradiating the water with ultraviolet light, dissolving away the non-cross-linked part of the photo-resist and then etching through the silicon dioxide to expose regions where diffusion will take place.

After the epitaxial layer is grown, the deep P+ diffusion to form the isolation borders for the cell is done. Thereafter, the P diffusion is done, the N diffusion is done and the oxide is etched to form the contact regions for the cell. Metalization is done according to the standard techniques of applying aluminum over the wafer, photomasking and etching away everywhere except where contacts are desired.

As will be understood by those familiar with the art, the present invention may be embodied in other specific forms without departing from the spirit or essential characteristics thereof. For example, the specific geometry shown could be varied so long as the N-doped region for the NPN emitter is within the P-doped region for the PNP collector and the PNP N-doped base also functions as the NPN collector. Additionally, the circular emitter regions of the power transistor of FIG. 7 could be square or the square regions of FIG. 4 could be circular or any other convenient geometry. Accordingly, the disclosure of the preferred embodiment of the present invention is intended to be illustrative, but not limiting, of the scope of the invention, which is set forth in the following claims.

What is claimed is:

1. A semi-custom semiconductor chip having a plurality of cells adaptable for forming either a bipolar, lateral PNP or an NPN transistor, each cell comprising:
a first N-doped region;
a first P-doped region;
at least one second P-doped region, larger than said first P-doped region, and positioned to partially surround said first P-doped region on opposite sides of said first P-doped region, said first N-doped region being located immediately adjacent said first P-doped region at a position where said at least one second P-doped region is not between said first P-doped region and said first N-doped region;
a second N-doped region located within one of said first and second P-doped regions;
at least one of said cells being connected to form an NPN transistor and not a PNP transistor; and
at least one of said cells being connected to form a lateral PNP transistor, and not an NPN transistor, with said second P-doped region as a collector, said first N-doped region as a base and said first P-doped region as an emitter.

2. The cell structure of claim 1 further comprising:
a first metal contact coupled to said first N-doped region as the collector of a NPN transistor;
a second metal contact coupled to said second P-doped region as the base of an NPN transistor; and
a third metal contact coupled to said second N-doped region as the emitter of said NPN transistor.

3. The cell structure of claim 1 further comprising:
a first metal contact coupled to said first N-doped region as the base of a PNP transistor;
a second metal contact coupled to said first P-doped region as the emitter of said PNP transistor; and
a third metal contact coupled to said second P-doped region as the collector of said PNP transistor.

4. The cell structure of claim 1 wherein said regions are formed in an N− epitaxial layer.

5. The cell structure of claim 4 further comprising:
a P-doped substrate beneath said epitaxial layer; and
a P-doped isolation region surrounding said cell structure and extending through said epitaxial layer to said P-doped substrate.

6. The cell structure of claim 5 further comprising an N+ buried layer extending into said P-doped substrate in the area beneath said first and second N-doped regions and first and second P-doped regions.

7. The cell structure of claim 6 further comprising an N+ diffused area extending from said first N-doped region to said N+ buried layer.

8. The cell structure of claim 1 wherein said first P-doped region is located proximate to a center of said cell and said second P-doped region partially surrounds said first P-doped region.

9. The cell structure of claim 1 further comprising an oxide layer covering said regions and defining openings above each of said regions.

10. A semicustom semiconductor chip having a plurality of cells adaptable for forming either a power bipolar, lateral PNP or NPN transistor, each cell comprising:
a pair of first, elongate N-doped regions on opposite sides of said cell parallel to each other;
a first, elongate P-doped region parallel to and between said first N-doped regions;
a pair of second P-doped regions arranged on opposite sides of said first P-doped region between and parallel to said first N-doped regions and parallel to said first P-doped regions;
a plurality of second N-doped regions located within said second P-doped regions; and
at least one of said cells having metal connections to form one of:
(a) a pair of lateral NPN power transistors with said first N-doped regions as collectors, said second P-doped regions as bases and said second N-doped regions as emitters, and
(b) a lateral PNP power transistor with said second P-doped regions as collectors, said first N-doped regions as bases and said first P-doped region as an emitter.

11. The cell structure of claim 1 further comprising:
a third P-doped region;
a third N-doped region located within said third P-doped region; and
a fourth N-doped region.

12. The cell structure of claim 11 wherein said first P-doped region is located proximate the center of said cell and said second and third P-doped regions partially surround said first P-doped region, forming first and second gaps where said first P-doped region is not surrounded, said first and fourth N-doped regions being located in said first and second gaps, respectively.

13. The cell structure of claim 11 further comprising an N+ buried layer beneath all of said regions of said cell.

14. The cell structure of claim 13 further comprising first and second diffused N+ areas extending from said first and fourth N-doped regions, respectively, to said N+ buried layer.

15. The cell structure of claim 14 further comprising first and second metal contacts coupled to said first and second N+ areas, respectively, to form a cross-under connection through said buried N+ layer.

16. The cell structure of claim 11 further comprising:
a first metal contact coupled to said first N-doped region to form a collector of a first NPN transistor;
a third metal contact coupled to said second N-doped region to form an emitter of said first NPN transistor;
a fourth metal contact coupled to said fourth N-doped region to form a collector of a second NPN transistor;
a fifth metal contact coupled to said third P-doped region to form a base of said second NPN transistor; and
a sixth metal contact coupled to said third N-doped region to form an emitter of said second NPN transistor.

17. The cell structure of claim 11 further comprising:
a first metal contact coupled to said first P-doped region to form an emitter of a PNP transistor;
a second metal contact coupled to said first N-doped region to form a base of said PNP transistor;

a third metal contact coupled to said second P-doped region to form a first collector of said PNP transistor; and a fourth metal contact coupled to said third P-doped region to form a second collector of said PNP transistor.

18. The cell structure of claim 10 further comprising an oxide layer covering said regions, said oxide layer having a plurality of openings to said second P-doped region between said second N-doped regions.

19. The cell structure of claim 10 further comprising an oxide layer covering said regions, said oxide layer having a plurality of openings to said second N-doped regions and a plurality of openings to said second P-doped regions in between said openings to said second N-doped regions.

20. The cell structure of claim 10 further comprising a buried N+ doped region beneath all of said previously mentioned regions.

21. A semicustom semiconductor chip having a plurality of identical cells adaptable for forming either two NPN transistors with a common collector and matched characteristics or a lateral PNP transistor with two collectors, each cell comprising:
   first and second identically shaped N-doped regions positioned at opposite corners of a rectangle;
   first and second identically shaped P-doped regions positioned opposite each other at the remaining corners of said rectangle, each of said first and second P-doped regions being substantially triangular in shape with a diagonal edge facing a center of said rectangle;
   a third P-doped region positioned in said center of said rectangle;
   third and fourth N-doped regions positioned in said first and second P-doped regions, respectively; and
   an N-doped buried layer extending beneath said rectangle and coupled to said first and second N-doped regions.

22. The semiconductor chip of claim 21 wherein each cell further comprises a fifth N-doped region located in said third P-doped region.

23. The cell structure of claim 20 further comprising N+ areas extending from said first N-doped regions to said buried N+ layer.

24. The semiconductor chip of claim 10 further comprising additional first and second P-doped regions arranged in alternating sequence between said first N-doped regions, said additional second P-doped regions each having a plurality of additional internal second N-doped regions.

25. The semiconductor chip of claim 21 wherein one of said cells is coupled as two NPN transistors with said first and second N-doped regions being the collectors, said collectors being coupled together through said buried layer, said first and second P-doped regions being the bases and said third and fourth N-doped regions being the emitters.

26. The semiconductor chip of claim 21 wherein at least one of said cells is connected as a dual collector PNP transistor with said first and second P-doped regions being the dual collectors, said first and second N-doped regions being the base and said third P-doped region being the emitter.

27. The semiconductor chip of claim 21 wherein at least one of said first and second P-doped regions is connected as a resistor by metal contacts coupled to opposite ends of said first or second P-doped region.

28. The semiconductor chip of claim 21 wherein at least one of said cells is used to form a cross under connection by metal connections coupled to said first and second N-doped regions.

29. The chip of claim 1 wherein said second N-doped region is located within said second P-doped region.

30. The chip of claim 1 wherein said second N-doped region is located within said first P-doped region.

31. A semiconductor cell adaptable for forming either a bipolar, lateral PNP or NPN transistor, comprising:
   a first N-doped region;
   a first P-doped region;
   at least one second P-doped region positioned to partially surround said first P-doped region on opposite sides of said first P-doped region, said first N-doped region being located adjacent said first P-doped region at a position where said at least one second P-doped region does not surround said first P-doped region; and
   a second N-doped region located within said second P-doped region; and
   an N+ buried layer coupled to said first N-doped region and extending below said first and second P-doped regions.

32. A semi-custom semiconductor chip having a plurality of cells adaptable for forming either a bipolar, lateral PNP or an NPN transistor, each cell comprising:
   a first N-doped region;
   a first P-doped region;
   second and third P-doped regions, larger than said first P-doped region, and positioned to partially surround said first P-doped region on opposite sides of said first P-doped region, said first N-doped region being located adjacent said first P-doped region at a position where said second and third P-doped regions are not between said first P-doped region and said first N-doped region;
   second and third N-doped regions located within said second and third P-doped regions, respectively;
   at least one of said cells being connected to form an NPN transistor and not a PNP transistor; and
   at least one of said cells being connected to form a lateral dual-collector PNP transistor, and not an NPN transistor, with said second and third P-doped regions as collectors, said first N-doped region as a base and said first P-doped region as an emitter.

33. A semiconductor cell structure adaptable for forming either a power bipolar, PNP or NPN transistor, each cell comprising:
   first and second elongate N-doped regions on opposite sides of said cell parallel to each other;
   first and second elongate P-doped regions parallel to and between said first N-doped regions;
   a third, elongate P-doped region between and parallel to said first N-doped region and said first P-doped region;
   a fourth elongate P-doped region between and parallel to said first and second P-doped regions;
   a fifth elongate P-doped region between and parallel to said second P-doped region and said second N-doped region; and
   a plurality of third N-doped regions located within said third, fourth and fifth P-doped regions.

34. The cell structure of claim 33 further comprising additional elongate P-doped regions arranged in alternating sequence between said first N-doped regions alternate ones of said additional P-doped regions having a plurality of additional internal third N-doped regions.

35. The cell structure of claim 33 wherein said third, fourth and fifth P-doped regions extend beyond said first and second P-doped regions and include portions extending perpendicular to said first and second N-doped regions to partially surround said first and second P-doped regions.

* * * * *